(12) United States Patent
Petrov et al.

(10) Patent No.: US 6,380,546 B1
(45) Date of Patent: Apr. 30, 2002

(54) FOCUSING ASSEMBLY AND METHOD FOR A CHARGED PARTICLE BEAM COLUMN

(75) Inventors: Igor Petrov; Bezalel Rechav, both of Nes Ziona (IL)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/479,664

(22) Filed: Jan. 1, 2000

(51) Int. Cl.[7] ............................... B21K 1/08; H01J 3/14
(52) U.S. Cl. .................................................. 250/396 R
(58) Field of Search ........................ 250/396 R, 292.2, 250/310

(56) References Cited

U.S. PATENT DOCUMENTS

| | | | | |
|---|---|---|---|---|
| 4,634,871 A | * | 1/1987 | Knauer | 250/398 |
| 4,698,509 A | * | 10/1987 | Wells et al. | 250/492.2 |
| 4,902,898 A | * | 2/1990 | Jones et al. | 250/492.2 |
| 4,926,054 A | * | 5/1990 | Frosien | 250/396 R |
| 5,502,306 A | * | 3/1996 | Meisburger et al. | 250/310 |
| 5,578,821 A | * | 11/1996 | Meisburger et al. | 250/310 |
| 5,734,164 A | * | 3/1998 | Sanford | 250/310 |

* cited by examiner

Primary Examiner—Jack Berman
Assistant Examiner—Johnnie L Smith, II
(74) Attorney, Agent, or Firm—Sughrue, Mion, Zinn, MacPeak & Seas LLP

(57) ABSTRACT

Method and assembly are presented for focusing a charged particle beam while directing it onto a specimen. The assembly comprises a lens arrangement producing a focusing field and first and second deflectors. The first deflector is accommodated within the focusing field, and the second deflector is accommodated downstream of the first deflector with respect to the direction of beam propagation, and is operable in a predetermined manner with respect to the operational mode of the first deflector.

30 Claims, 13 Drawing Sheets

FOCUSING ASSEMBLY AND METHOD FOR A CHARGED PARTICLE BEAM COLUMN

FIELD OF THE INVENTION

The present invention is in the field of measurement and inspection techniques, and relates to a focusing assembly and method to be used in a charged particle beam column.

BACKGROUND OF THE INVENTION

Charged particle beam columns are typically employed in scanning electron microscopy (SEM), which is a known technique widely used in the manufacture of semiconductor wafers, being utilized in a CD metrology tool, the so-called CD-SEM (critical dimension scanning electron microscope) and defect review SEM. SEM typically includes such main constructional parts as an electron beam source and an electron beam column. The electron beam column comprises inter alia a focusing assembly and a detection unit. The focusing assembly typically includes a lens arrangement and a deflector. The detection unit may comprise an appropriate number of detectors for detecting secondary electrons and/or back-scattered electrons. A wafer under inspection is located on a stage under the electron beam column. Such a SEM is disclosed, for example, in U.S. Pat. No. 5,502,306.

One of the common goals of all imaging systems consists of increasing the image resolution. In SEM, in order to reduce the "spot" size of the electron beam up to nanometers, a highly accelerated electron beam is typically produced using accelerating voltages of several tens of kilovolts and more. Specifically, the electron optic elements are more effective (i.e. produce smaller aberrations) when the electrons are accelerated to high kinetic energy. However, it has been observed that such a highly energized electron beam causes damage to resist structures and integrated circuits, and, in the case of dielectrical specimens, causes undesirable charging of the specimen.

One prior art technique for focusing charged particles on a specimen, which is aimed at solving the above problem, utilizes the introduction of a retarding electrostatic immersion lens in the path of a focused beam of accelerated charged particles, so as to decelerate them prior to hitting the sample. The provision of the retarding field in the path of a deflected focused beam reduces the aberration of focusing and deflecton. For further relevant information about this technique, the disclosure in U.S. Pat. No. 4,926,054 can be referred to.

Deceleration of the electrons can generally be accomplished by selectively creating a potential difference between the pole piece of a magnetic objective lens and the specimen. Alternatively, the same effect can be achieved by actually introducing electrodes having selective potential applied thereto.

However, due to the low-energy of the beam having been decelerated, dispersion of the beam is observed. Chromatic aberration of focusing and deflection is more severe in the low-energy beam than in the high-energy beam.

Thus, one of the main problems of scanning electron microscopy is associated with the following. A high-energy electron beam is required for focusing purposes, and deflection of this beam is required for scanning purposes (i.e., to illuminate a certain scan area). Ideally, all the electrons of the primary electron beam generated inside a column have the same energy. However, in practice, some variation in energy is present among the electrons. This variation degrades the image in two ways. First, when electrons pass through a lens, the focusing effect of the lens depends on the individual electron's energy. Hence, electrons having different energies are affected by the lens differently. This causes chromatic aberration (the energy of the electrons is analogous to wavelength of light beam in optical systems). In the second way, when charged particles pass through a deflector, the effect of the deflecting field depends on the energy of the electron. Therefore, electrons of different energies are deflected to different extents, and, consequently, chromatic aberration of deflection is added to the unavoidable chromatic aberration of focusing. Chromatic aberration of deflection is proportional to the angle of deflection. Hence, image quality deteriorates with the distance from the center of the scan area. Chromatic aberration of deflection increases with the reduction of beam energy.

Another known problem of the inspection systems of the kind specified is associated with locating defects (foreign particles) on patterned surfaces. The pattern is typically in the form of a plurality of spaced-apart grooves. To detect the existence of a foreign particle located inside a narrow groove, it is desirable to tilt the scanning beam with respect to the surface, which tilting should be applied to selective locations on the specimen. As proposed in U.S. Pat. No. 5,734,164, a tilt mechanism is implemented by mechanically tilting the wafer carrier relative to the charged particle beam column. The maximum angle of beam incidence on the wafer reaches sixty degrees. It is needless to say that such a mechanical tilting of the specimen carrier, as well as the mechanical tilting of the column as disclosed in U.S. Pat. No. 5,329,125, is difficult to implement and is time consuming.

SUMMARY OF THE INVENTION

There is accordingly a need in the art to improve conventional scanning electron microscopy by providing a novel focusing assembly and method to be used in a charged particle beam column.

It is a major feature of the present invention to provide such a system that allows for the non-destructive inspection of specimens with high quality imaging. Non-destructive inspection is an inspection that causes no physical damage to the specimen under inspection.

It is a futher feature of the present invention to provide such a system that facilitates the inspection and measurements of patterned specimens, such as semiconductor wafers, masks, reticles, etc.

The main idea of the present invention is based on the use of first and second deflectors, wherein the first deflector is accommodated in a focusing field of a lens arrangement, and the second deflector is accommodated in the focusing field in the path of a charged particle beam deflected by the first deflector, and wherein the second deflector operates in a predetermined suitable mode with respect to that of the first deflector. By this, chromatic aberrations of deflection are substantially reduced. Moreover, the provision of the first and second deflectors enables a certain average (at least small) angle of incidence of the charged particle beam to be provided with reduced chromatic aberrations. The tilting of the incident charged particle beam is achieved by adjusting the operational mode of the second deflector with respect to that of the first deflector. As indicated above, the tilting of the incident beam is desired, for example, to detect defects that cannot be detected with the normal incidence of the charged particle beam, namely when operating with the normal deflection mode. Such a defect may, for example, be a particle located on the inner surface of the side wall of a narrow groove.

To reduce the chromatic aberration of deflection with the normal incidence of the charged particle beam ("normal deflection mode"), the first and second deflectors deflect the beam in the same direction. In this case, an electric field in the vicinity of the specimen may be substantially low, i.e., in a range (−100–1000)V/mm.

To provide the desired tilting of the incident beam (the so-called "tilt" mode), the first and second deflectors may deflect the beam either in two opposite directions, namely the first deflector deflects the beam away from the axis of beam propagation, and the second deflector deflects the beam towards the axis, or in the same direction, away from the axis of beam propagation. In this case, an electric field in the vicinity of the specimen is preferably substantially high, as compared to that of the normal deflection mode, e.g., is in a range 1–5 kV/mm. By appropriately operating the first and second deflectors deflecting the beam in two opposite directions, the beam can be applied to the same point as with the normal deflection mode, thereby providing the so-called "on-axis tilt".

Thus, according to one aspect of the present invention, there is provided a focusing assembly for directing a charged particle beam onto a specimen, the focusing assembly comprising:

(a) a lens arrangement producing a focusing field;

(b) a first deflector accommodated within the focusing field and operable with a preset mode to provide beam deflection in a predetermined direction; and (c) a second deflector accommodated downstream of the first deflector with respect to the direction of beam propagation, the second deflector being operable with a predetermined mode with respect to the operational mode of the first deflector.

The lens arrangement includes an objective magnetic lens composed of two pole pieces, and may include a retarding electrostatic immersion lens producing the electric field. Alternatively, the electric field may be produced by the magnetic objective lens. Preferably, the first deflector is magnetic, while the second deflector may be either electrostatic or magnetic.

When the first deflector is of a magnetic type and is accommodated within the gap of the magnetic objective lens, rotation of the deflected charged particle beam unavoidably occurs. To compensate for such a rotation effect produced by the first deflector and the magnetic objective lens, the plane of deflection of the second deflector should be rotated accordingly, i.e., by the same angle of rotation. This is achieved by creating a "rotation field" by the first deflector.

The focusing assembly may be used in any charged particle beam column.

According to another aspect of the present invention, there is provided a method for focusing a charged particle beam whilst directing it onto a specimen.

According to yet another aspect of the present invention, there is provided a charged particle beam column comprising:

a charged particle beam source; and a focusing assembly for directing the charged particle beam onto a specimen comprising:

a lens arrangement producing a focusing beam;

a first deflector accommodated within the focusing field and operable with a preset mode to provide beam deflection in a predetermined direction; and a second deflector accommodated downstream of the first deflector with respect to the direction of beam propagation, the second deflector being operable with a predetermined mode with respect to the operational mode of the first deflector.

According to yet another aspects of the present invention a method and system are provided for inspecting a specimen utilizing a focusing assembly constructed as described above.

The use of the first and second deflectors enables stereoscopic imaging of a specimen. To this end, the direction fields of the first and second deflections should be selectively reversed. Thus, according to yet another aspect of the present invention, there is provided a method for imaging a specimen by a charged particle beam, the method comprising the steps of:

generating said charged particle beam and directing it towards the specimen;

generating a focusing field for focusing the beam onto the specimen;

generating a first deflection field within said focusing field for deflecting the beam in a predetermined direction;

generating a second deflection field downstream of the first deflection field with respect to the direction of beam propagation, said second deflection field deflecting the beam deflected by the first deflection field in a predetermined manner with respect to the first deflection; and selectively reversing the direction fields of the first and second deflections, thereby obtaining stereoscopic images of the specimen.

The charged particle beam many be an electron beam or a focused ion beam (FIB). The present invention may be used in a SEM or the like tool applied to a specimen, e.g., a semiconductor wafer, for imaging, measurements, metrology, inspection, defect review or the like purposes. For example, the present invention may be used for CD measurements, line profile measurements, copper-interconnects inspection/measurements typically performed after a photolithography process, automatic defect classification, etc.

More specifically, the present invention is used with SEM system for inspecting wafers, masks or reticles, and is therefore described below with respect to this application.

BRIEF DESCRIPTION OF THE DRAWINGS

In order to understand the invention and to see how it may be carried out in practice, a preferred embodiment will now be described, by way of non-limiting example only, with reference to the accompanying drawings, in which:

FIG. 2b more specifically illustrates a second deflector in the focusing assembly of FIG. 2a;

FIG. 8b is a beam diagram corresponding to the operation of the system of FIG. 1 according to another embodiment of the invention to detect the defect shown in FIG. 8a;

DETAILED DESCRIPTION OF A PREFERRED EMBODIMENT

Figure 1:
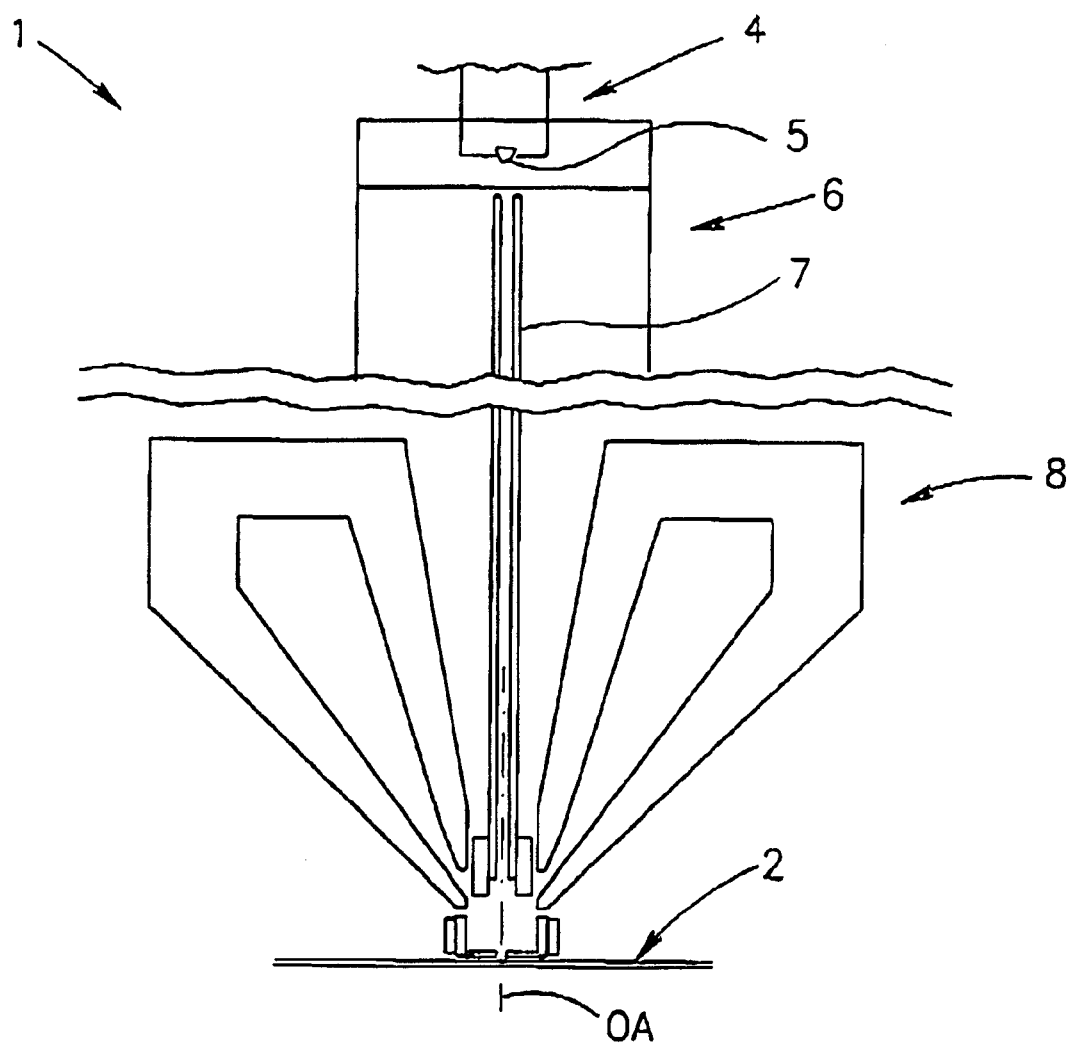
FIG. 1 is a schematic illustration of the main components of a system according to the invention.

Referring to FIG. 1, there are illustrated the main components of a SEM system, generally designated 1, associated with a wafer 2 to be inspected. The system 1 typically comprises an electron beam source 4 (a so-called "electron gun") having a small tip 5, and a beam directing column 6 having an anode tube 7 that defines a beam drift space. The column 6 also typically comprises beam blank means, several apertures, aperture alignment coils, and an appropriate final aperture, which are not specifically shown. The construction and operation of all these element do not form the part of the present invention and therefore need not be specifically described.

Further provided in the column 6 is a focusing assembly, generally designated 8, producing a focusing field. The assembly 8 is accommodated in the path of the electron beam propagating towards the wafer 2. As better shown in FIG. 2a, the focusing assembly 8 comprises a lens arrangement, composed of an objective lens 12 and a retarding electrostatic immersion lens 14 mounted downstream of the lens 12, and two magnetic deflectors 16 and 18 (e.g. coils).

The objective lens 12 is typically magnetic lens formed by two pole pieces 12a and 12b defining the magnetic lens gap. As for the electrostatic lens 14, in the present example it is formed by several electrodes—three electrodes 14a, 14b and 14c. The lower end of the anode tube 7 serves as the first electrode 14a, and the wafer's surface serves as the second electrode 14c. The third electrode 14b is located between the electrodes 14a and 14c, and serves for regulating an electric field created within the vicinity of the wafer. The electrostatic immersion lens may have any other suitable design, as will be described more specifically further below with reference to FIGS. 3a and 3b. The first deflector 16 is mounted within the magnetic lens gap, and the second deflector 18 is mounted within the electrostatic field produced by the lens 14.

Figure 2A:
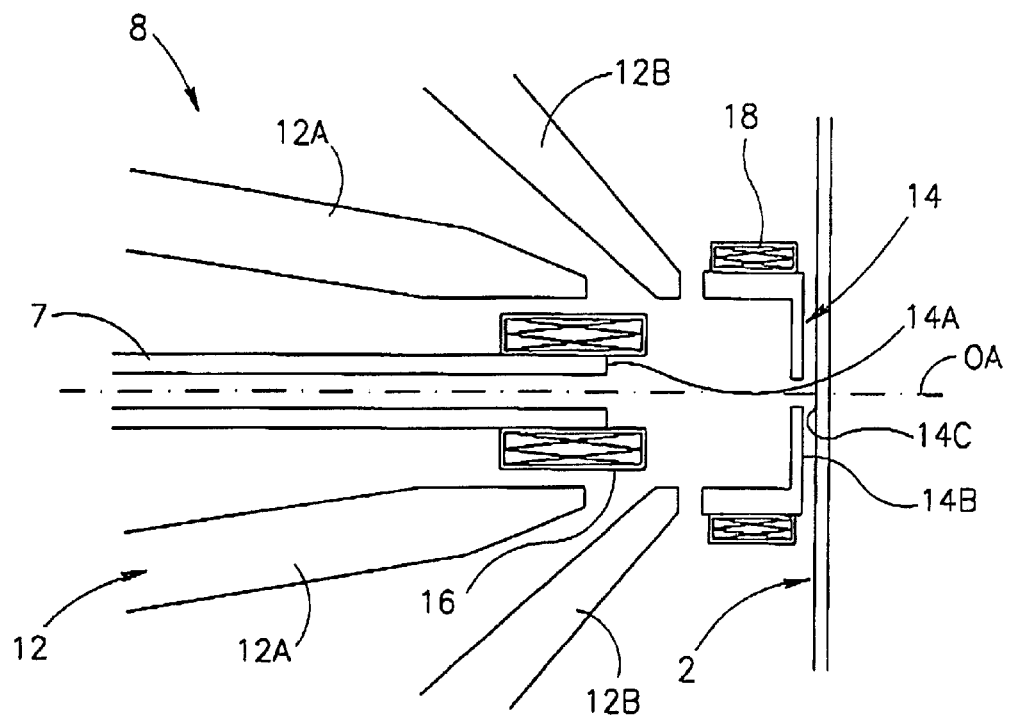
FIG. 2a more specifically illustrates a focusing assembly according to one example of the invention suitable for the system of FIG. 1.
Figure 2B:
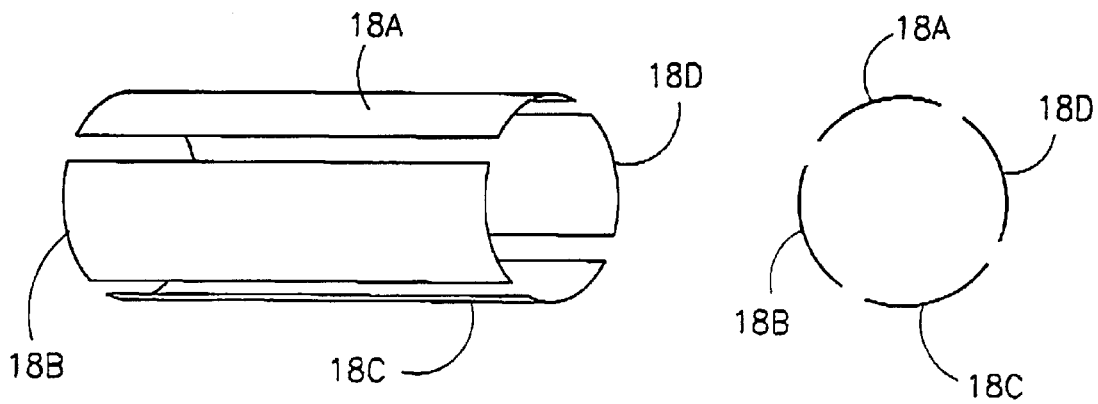

In the example of FIG. 2a, the second deflector 18 is magnetic. It should, however, be noted that the second deflector may be electrostatic (e.g. condenser plates). One possible design of an electrostatic deflector 18' is shown in FIG. 2b. The deflector 18' is a quadruple deflector comprising four identical spaced-apart plates 18a–18d mounted on an isolator (not shown).

The propagation of the electron beam within the column 6 defines an optical axis OA. The objective lens 12 and the first deflector 16 typically provide magnetic fields directed, respectively, along and transverse the optical axis OA, thereby focusing the electron beam onto the wafer and causing the beam to deflect from the optical axis (i.e. to scan the wafer).

Generally, the landing energy of the electron beam is defined by the potential difference between the cathode 5 and the wafer 2. To achieve the desired acceleration of electrons, appropriate potential difference between the cathode 5 and anode 7 should be provided. For example, the cathode voltage $V_c$ can be about (−1) kV and the anode voltage $V_a$ can be about (+8) kV. Hence, the electrons are accelerated on their way towards the magnetic lens 12 having the velocities of 9 keV.

The electrostatic lens 14 acts to decelerate the electrons in the closest vicinity of the wafer 2. To this end, the voltage $V_2$ applied to the second electrode 14c (wafer's surface) is typically substantially less than that of the anode 7. For example, the case may be such that the wafer is grounded ($V_2=0$), and the electrodes are biased, that is the following voltages may be applied to, respectively, cathode 5, anode 7 and third electrode 14b: $V_c=(-1)$ kV; $V_a=(+8)$ kV and $V_3=(+3)$ kV.

Figure 3A:
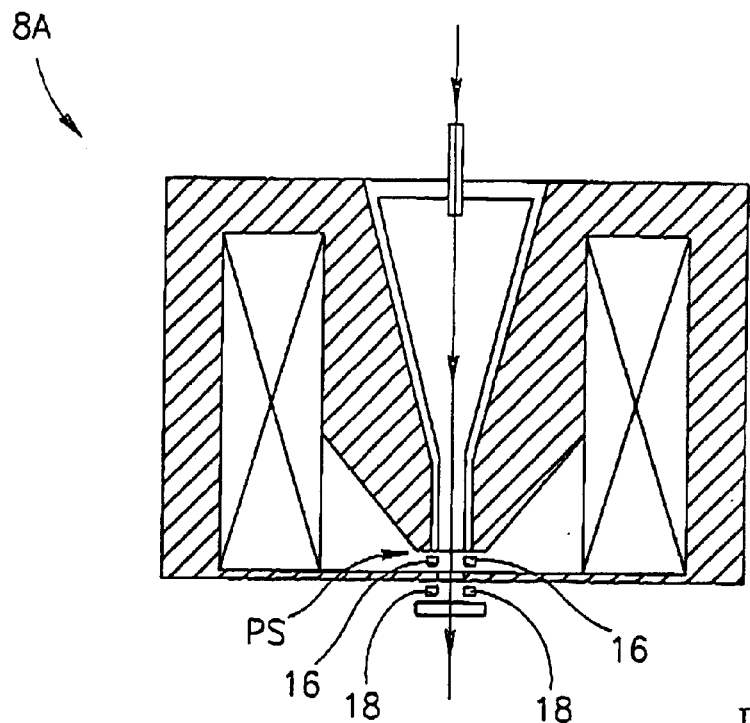
FIGS. 3a and 3b are schematic illustrations of two more examples, respectively, of the focusing assembly suitable for the system of FIG. 1.
Figure 3B:
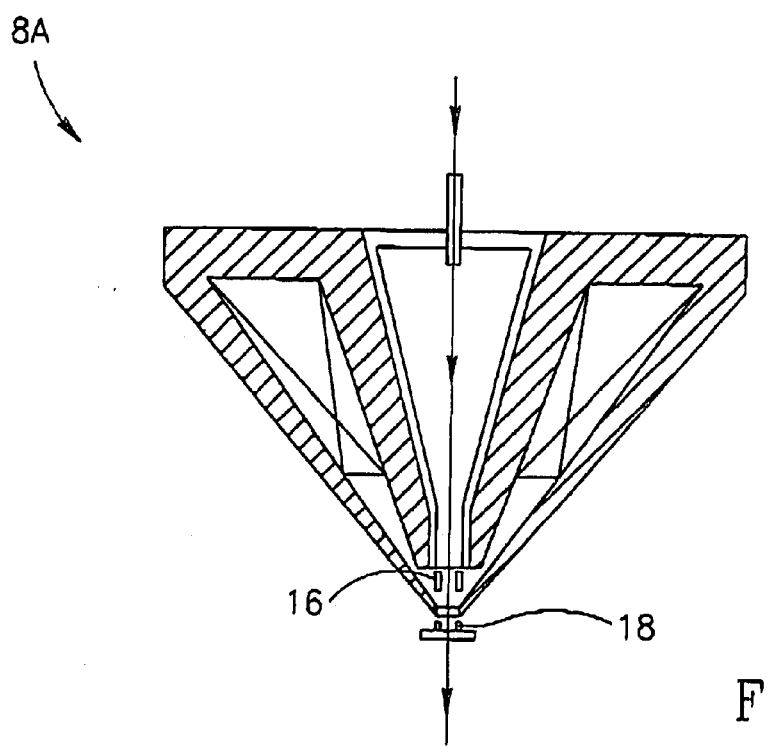

FIGS. 3a and 3b illustrates the main components of focusing assemblies, generally designated 8a and 8b, respectively, having somewhat different construction as compared to the assembly 8 and being suitable for use as a component of the system 1. A primary electron beam PE generated by an electron beam source (not shown) is focused on a specimen PR. Each of the assemblies 8a and 8b comprises a lens arrangement and the first and second deflectors 16 and 18. The lens arrangement is composed of a magnetic lens ML formed by upper and lower pole pieces OP and UP defining a pole piece gap PS, and an electrostatic immersion lens formed by an electrode KE and the lower pole piece UP.

According to the example of FIG. 3a, the electrode KE of the electrostatic immersion lens is in the form of a truncated cone tapering in the direction of the specimen PR and includes a cylindrical projection in the region of the pole piece gap PS. The electrode KE is arranged in insulating fashion within a bore in the upper pole piece OP and concentrically with the symmetry axis OA of the entire system. In order to establish a nearly rotationally symmetrical electrical retarding field, the electrode KE of the immersion lens is placed at a positive potential relative to the lower pole piece UP, the positive potential being, for example, within the range of 5–10 kV.

According to the example of FIG. 3b, the pole pieces OP and UP are shaped so as to form a conical magnetic lens ML. Here, the electrode KE in the form of a truncated cone is located within the upper pole piece OP of the magnetic lens ML at a positive potential.

The above design of the lens arrangement is disclosed in U.S. Pat. No. 4,831,266, which is therefore incorporated herein by reference with respect to this specific example.

The provision of any electrostatic lens as an actual physical element is optional. The same effect of electrons' deceleration, namely the creation of a retarding electric field, may be achieved by applying appropriate voltages to the anode and wafer, or to anode, pole piece and wafer. Following are two possible examples of the electric parameters:

(1) the wafer is biased to (−5) kV, the anode voltage is equal to zero and the cathode voltage is (−6) kV;

(2) the wafer is biased to (−3) kV, the pole piece voltage is equal to zero, and the anode and cathode voltage are, respectively, (+5) kV and (−4) kV.

The decelerated electron beam impinges onto the wafer's surface within a scan area, and knocks-out secondary electrons. The electric field produced, for example, by the electrostatic lens 14, whilst decelerating the incident electrons, acts as an accelerating field for the secondary electrons, and thereby provides the propagation of the secondary electrons towards a detector (not shown).

Figure 4A:
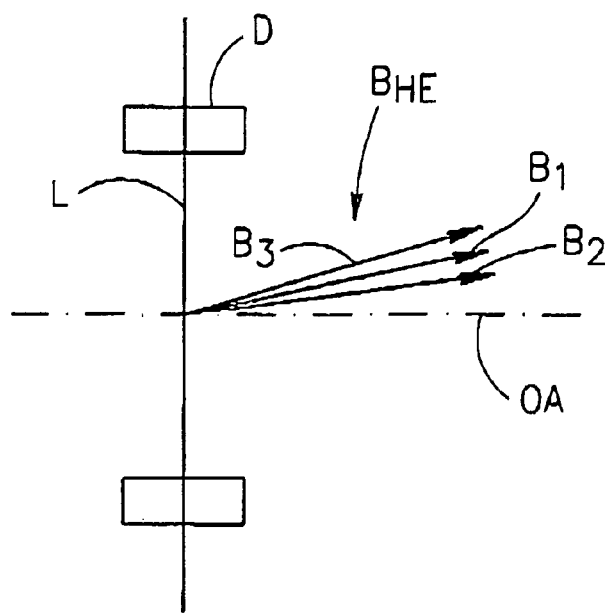
FIGS. 4a and 4b illustrate the main operational principles of focusing and deflection in the system of FIG. 1 affecting the charged particles' distribution within a scan area.
Figure 4B:
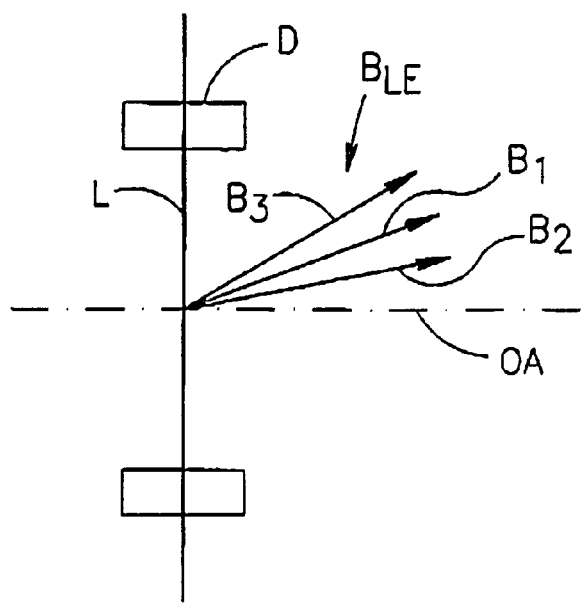

FIGS. 4a and 4b illustrate the diagrams of propagation of deflected high-enter and low-energy eletron beams $B_{HE}$ and $B_{LE}$, respectively. Due to the variance in energy, the beam particles are dispersed into three different beams $B_1$, $B_2$ and $B_3$, wherein beam $B_1$ is formed by particles having an average energy, beam $B_2$ is formed by particles of relatively high-energy, and beam $B_3$ is formed by particles of relatively low-energy. As can be seen, high-energy particles are less diffracted can low-energy particles. This difference will cause enlargement of the diameter of the electron beam, and consequently, the reduction of resolution. This is also referred to as chromatic aberrations of deflection. As also clearly seen in FIGS. 4a and 4b, the low-energy beam $B_{LE}$ is characterized by more expressed chromatic aberrations, than the high-energy beam $B_{HE}$.

Thus, the desirable deceleration of the electron beam before its interaction with the wafer increases chromatic aberrations of deflection. This results in the non-uniformity of resolution within a raster.

Figure 5A:
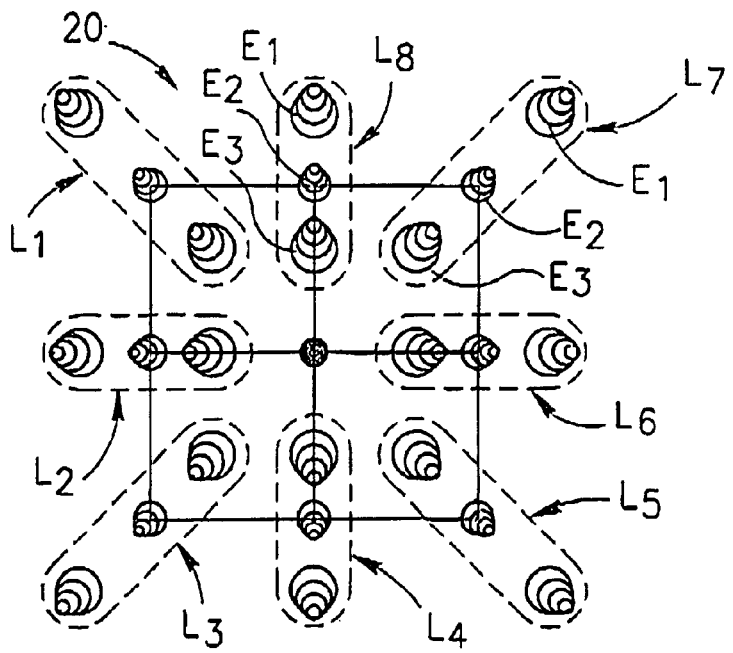
FIGS. 5a to 5c are spot diagrams corresponding to three different operational modes of the system of FIG. 1, respectively, according to one embodiment of the invention.
Figure 6A:
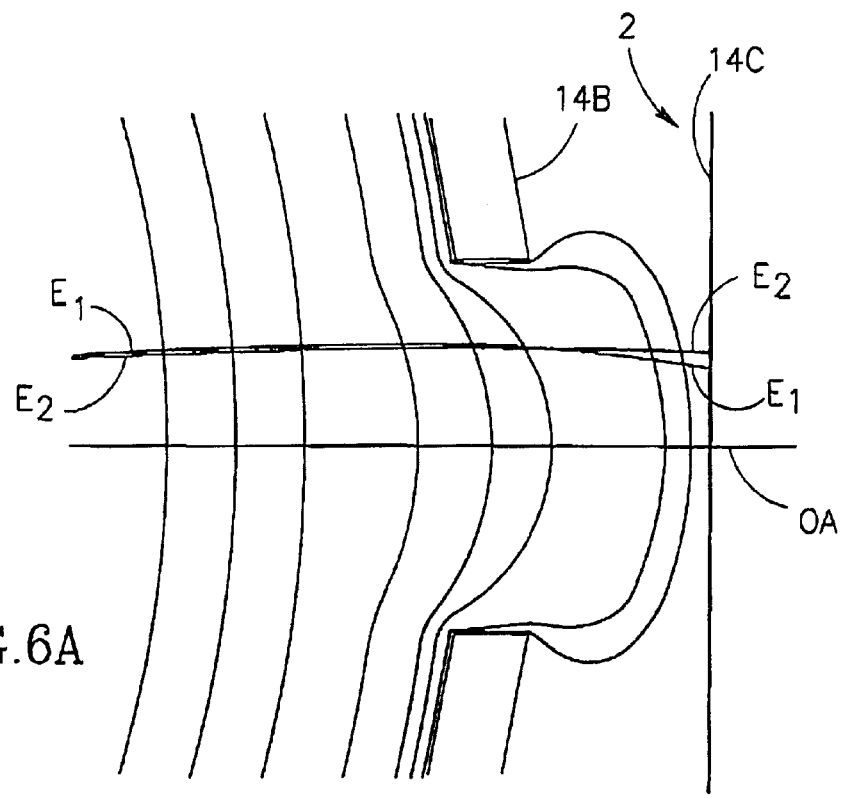
FIGS. 6a to 6c illustrate beam diagrams corresponding to the spot diagrams of FIGS. 4a–4c, respectively.

FIGS. 5a and 6a illustrate a spot diagram and a beam diagram, respectively, representing simulation results of the operation of the system 1, when the first deflector 16 is in its operative position and the second deflector 18 is in its inoperative position. This actually corresponds to the operation of the conventional SEM system, improved by the provision of an electrostatic lens as proposed in the above U.S. Pat. No. 4,926,054. The deflector 16 deflects the electron beam from the optical axis OA, and the electrostatic lens 14 provides the desired deceleration of the deflected electron beam. The following working conditions were applied: the average electron energy $E_{av}$ is about 500 eV with a pick-to-pick dispersion of 0.5V (Schottky emission cathode), the voltage $V_3$ on the third electrode 14b is very close to that of the second electrode 14c (e.g., the wafer is grounded, and $V_3$=0). Calculations used were based on known Electron Beam Software Package commercially available from Munro Ltd.

A main field (raster) 20 in the form of a quadrant with the electrons' distribution therein is shown in FIG. 5a. In the present example, the dimensions of the field (or a field of view) are about 100 μm. In each of eight spaced-apart locations $L_1$–$L_8$ within a periphery region of the field 20, three spaced-apart spots are obtained produced by electrons $E_1$, $E_2$ and $E_3$ having the lowest, average and the highest energy, respectively. The spot scale is about 0.03 μm. Thus, the conventional SEM system provides significant image blurring within the periphery region of the raster field. This problem becomes more essential with the reduction of the pixel size.

Figure 5B:
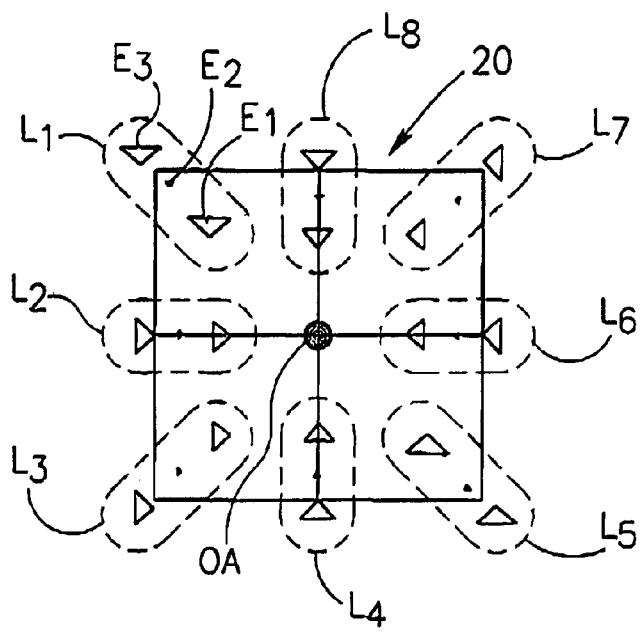
Figure 6B:
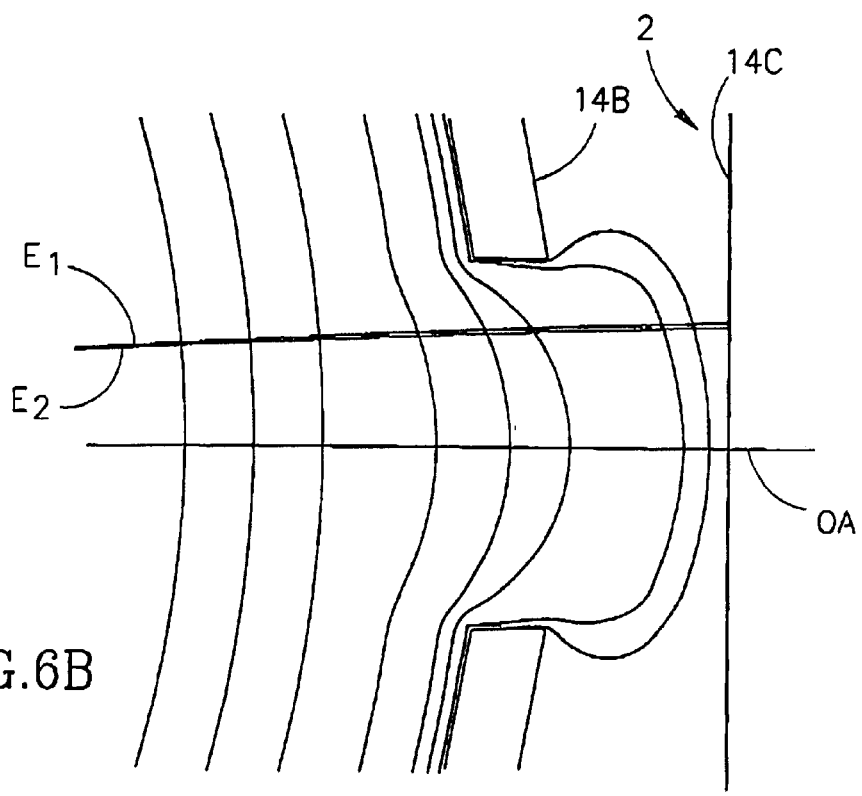

FIGS. 5b and 6b illustrate spot and beam dips, respectively, obtained in a similar manner, but when the first deflector 16 is in its inoperative position and the second deflector 18 is in the operative positions. The operational mode of the second deflector 18 is such as to provide the beam deflection in the same direction, as that of the deflector 16 in the example of FIGS. 5a and 6a. As shown, in the present example, the similar image blurring is observed, but with the relative locations of the lowest- and highest-energy electrons $E_1$ and $E_3$ being opposite to those shown in the previous example.

Figure 5C:
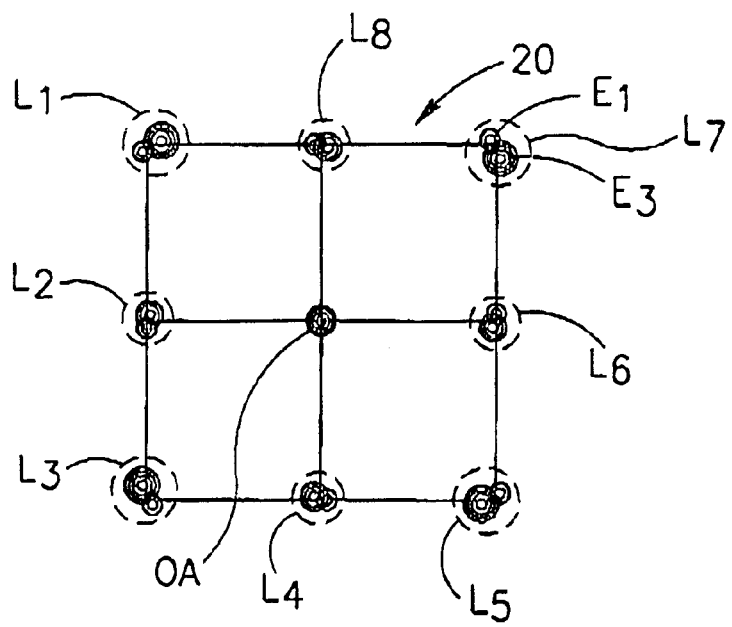
Figure 5D:
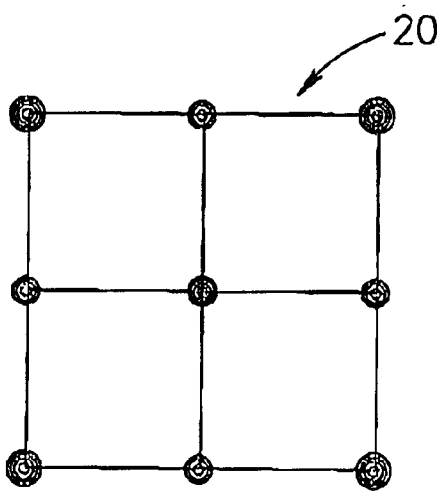
FIG. 5d is a spot diagram illustrating some more features of the focusing assembly according to the invention.
Figure 6C:
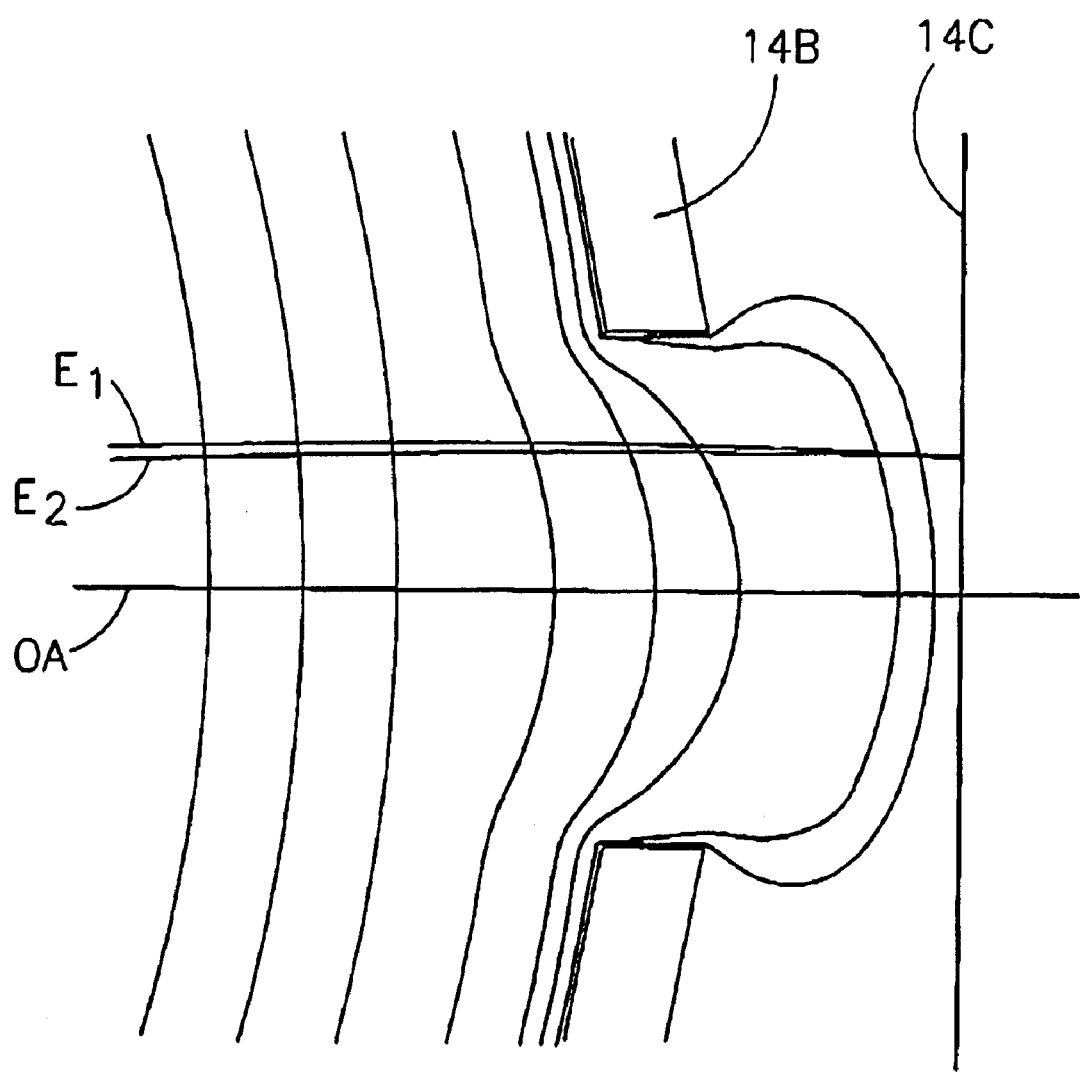

Turning now to FIGS. 5c and 6c, there are illustrated spot and beam diagrams, respectively, representing the simulation results of the operation of the system 1 under the same working condition ($E_{av}$=500 eV; $V_3 \approx V_2$), but having both the first and second deflectors 16 and 18 in their operative positions. The deflectors 16 and 18 deflect the electron beam in the same direction. The first deflector 16 deflects the beam with positive sign chromatic aberrations (i.e. the lower the energy, the more the deflection), and the second deflector 18 operates in combination with the electrostatic field of the lens 14 to deflect the beam with negative sign chromatic aberrations (the lower the energy, the less the deflection). As a result total chromatic aberrations of the focusing assembly 8 are substantially reduced, and the uniformity of the resolution within the raster 20 is substantially improved, as compared to that of FIGS. 4a–5a and 4b–5b.

It should be noted that the planes of deflection of both the first and second deflectors 16 and 18 should coincide. This is associated with the following. The first deflector 16 is a magnetic one accommodated within the gap of the magnetic lens 12, which unavoidably rotates the deflected electron beam. For example, with the electrons' energy of 8.5 keV, the electron beam is rotated by approximately 40° from the plane of deflection. Consequently, the plane of deflection of the second deflector 18 should be rotated by the same angle in the opposite direction.

In the present invention, to compensate the rotation effect produced by the first deflector 16 and the magnetic lens 12, a "rotation field" is created by the first deflector 16 (or by the second deflector 18 if a magnetic deflector is used), rather than turning the second deflector 18. To this end, a so-called "mixed supply" (i.e., currents or voltages) is fed to the coils of the first deflector 16 along the X- and Y-axes. This rotation field compensates for the electron beam rotation so as to provide coincidence of the planes of deflection of both deflectors 16 and 18. As a result, the beam deflected by the first deflector 16 enters the field of the second defector 18 in the direction of deflection of the second deflector. As shown in FIG. 5d, this effect improves the uniformity of the resolution within the raster 20 even more. It should be specifically noted that such a rotation, compensating field may be produced by appropriately supplying the second, magnetic deflector 18, or by mechanically turning this deflector 18.

Figure 7A:
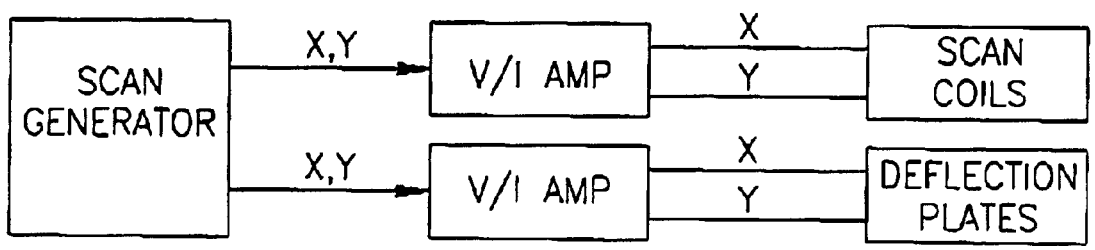
FIGS. 7a and 7b illustrate block diagrams of electric schemes for supply of the first and second deflectors according to two different examples, respectively.
Figure 7B:
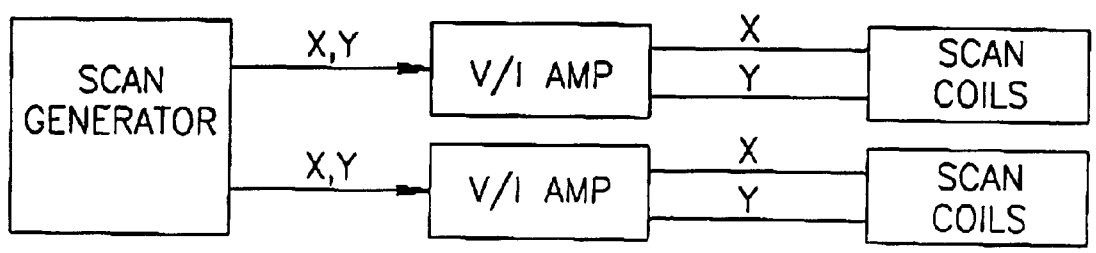

Turning now to FIGS. 7a and 7b, there are illustrated block diagrams, generally designated 22a and 22b, showing in a self-explanatory manner two different examples, respectively, of an electric scheme for supply of the deflectors 16 and 18. According to FIG. 7a, when the first and second deflectors are magnetic and electrostatic, respectively, they are associated with voltage/current amplifier (V/I AMP) and voltage/voltage amplifier (V/V AMP), respectively. Alternatively, when both the first and second deflectors are magnetic, two V/I amplifiers are used (FIG. 7b).

Thus, the present invention enables the undesirable chromatic aberration of deflection to be substantially reduced. This is due to the following features: provision of the first and second deflectors 16 and 18 within the focusing field produced by the lens arrangement; and provision of predetermined operational modes of the deflectors 16 and 18. Such a deflection arrangement is generally referred to by the inventors as an in-lens and post-lens deflectors. The region of the electrons' deceleration is located within the electric field, produced for example by the retarding electrostatic immersion lens 14, in the vicinity of the wafer. The operational modes of the deflectors 16 and 18 are such as to deflect the electron beam in the same direction. The operational mode of the electrostatic lens 14 is such as to create a substantially low electric field, e.g., (−100)–(1000)V/mm, within the vicinity of the wafer's surface, for example, by applying substantially equal voltages to the electrodes 14b and 14c.

Figure 8A:
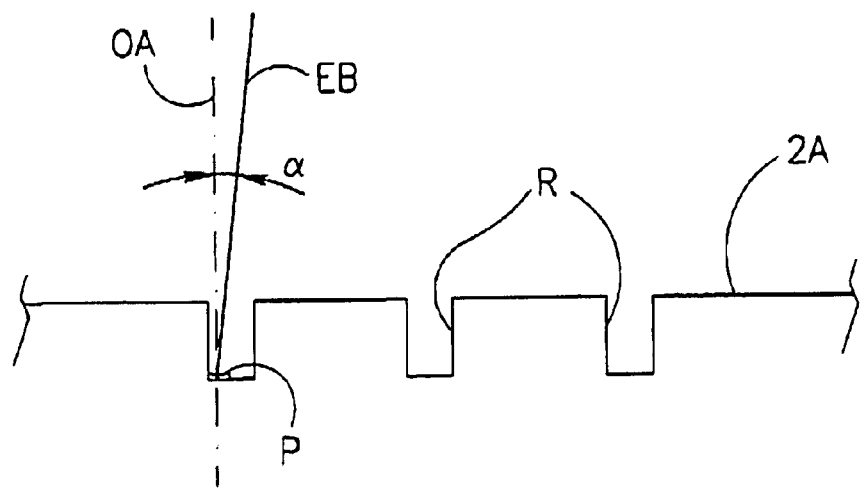
FIG. 8a illustrates the patterned surface of a wafer containing a defect.

Reference is made to FIGS. 8a–8e illustrating one particular beneficial use of the invention. FIG. 8a illustrates a patterned surface 2a of the wafer 2 formed with a plurality of grooves R When the width W of the groove R is less than its depth D (W is from ½ to ¼ of D), normal incidence of the electron beam (normal deflecton mode) will result in practically no secondary electrons output from the groove R. However, for metrology and inspection purposes, it is desirable to obtain an image of the groove's walls.

To enable a so-called "side wall imaging", it is desirable to tilt the incident electron beam EB to provide at least a small angle of incidence a (3°–6°). On the one hand, it is desirable to apply this "tilt" mode selectively. This means that whilst the successive areas of the wafer are continuously inspected with the normal deflection mode, at a specific location (i.e. for a specific area) the system should be switched to the "tilt" mode. On the other hand, the "tilt" mode should be applied to the same point on the wafer as that captured with the normal deflection mode. This can be implemented by a combined effect of the relatively strong electric field (as compared to that used in the normal mode) and of the "tilt" mode.

It should also be noted that a successful "side wall imaging" by tilting the incident beam can be achieved when no extraction electric field (or "boosting voltage") is used, namely when the following condition takes place: $V_{anode} \approx V_{pole/piece} \approx V_{wafer}$. In this case, although the provision of the second deflector may not sufficiently affect chromatic aberrations of deflection, the appropriate operation of this deflector would provide successful tilting of the incident beam, namely, which would enable the inspection of the same location on the wafer in the "normal" and "tilt" modes. The provision of the extraction field, however, typically improves imaging.

Figure 8B:
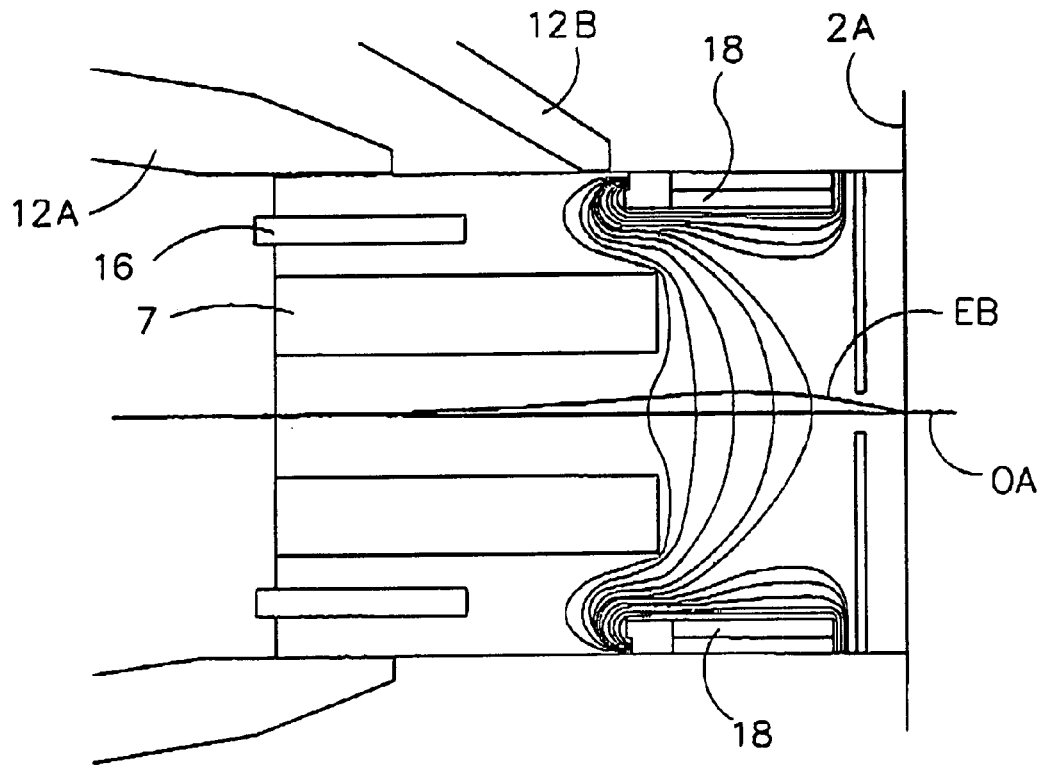

FIG. 8b illustrates the propagation of an incident electron beam EB within the focusing assembly 8, operating to provide the desired tilting of the beam EB. For this purpose, first and second deflectors 16 and 18' operate to deflect the beam in two opposite directions, respectively. The first deflector 16 deflects the electron beam away from the optical axis OA, and the second deflector 18' deflects the beam towards the optical axis. This sequential deflection of the electron beam provides inclined incidence of the beam onto a location on the optical axis OA. For this purpose, the voltage $V_3$ of the third electrode 14b is substantially increased (e.g., $V_3$=3 kV) as compared to that of the previous, "normal" mode of operation (i.e., $V_3$=0). This results in a substantially strong electric field within the vicinity of the wafer.

Figure 8C:
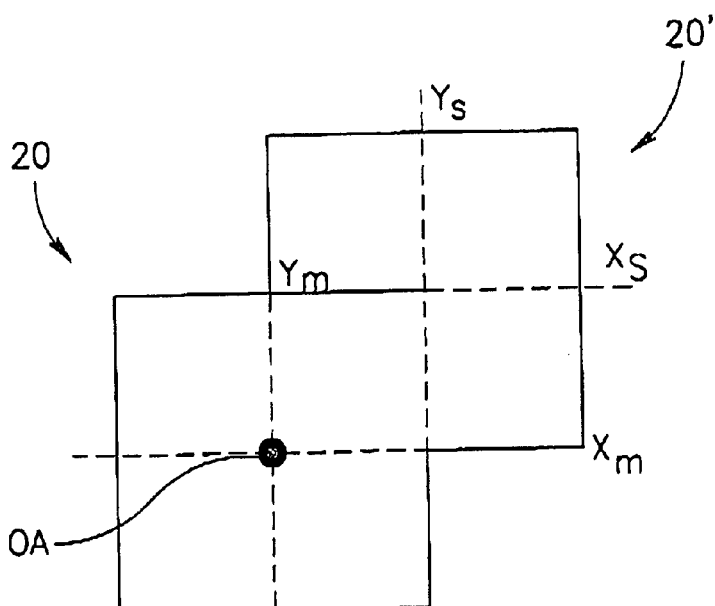
FIG. 8c illustrates a scheme of calculations suitable for analyzing the operation of first and second deflectors.

FIG. 8c illustrates a calculation scheme used in the present example for the analysis of the operation of the system 1. The operation of the first deflector 16 produces a main field (raster) 20 in the X-Y coordinate system centered at the optical axis OA. The operation of the second deflector 18 produces a sub-field 20'. The grid scale of both the main field and sub-filed is 0.3 mm, i.e., $X_m$=0.3 mm, $Y_m$=0.3 mm and $X_s$=0.3 mm, $Y_s$=0.3 mm.

Figures 8D, 8E:
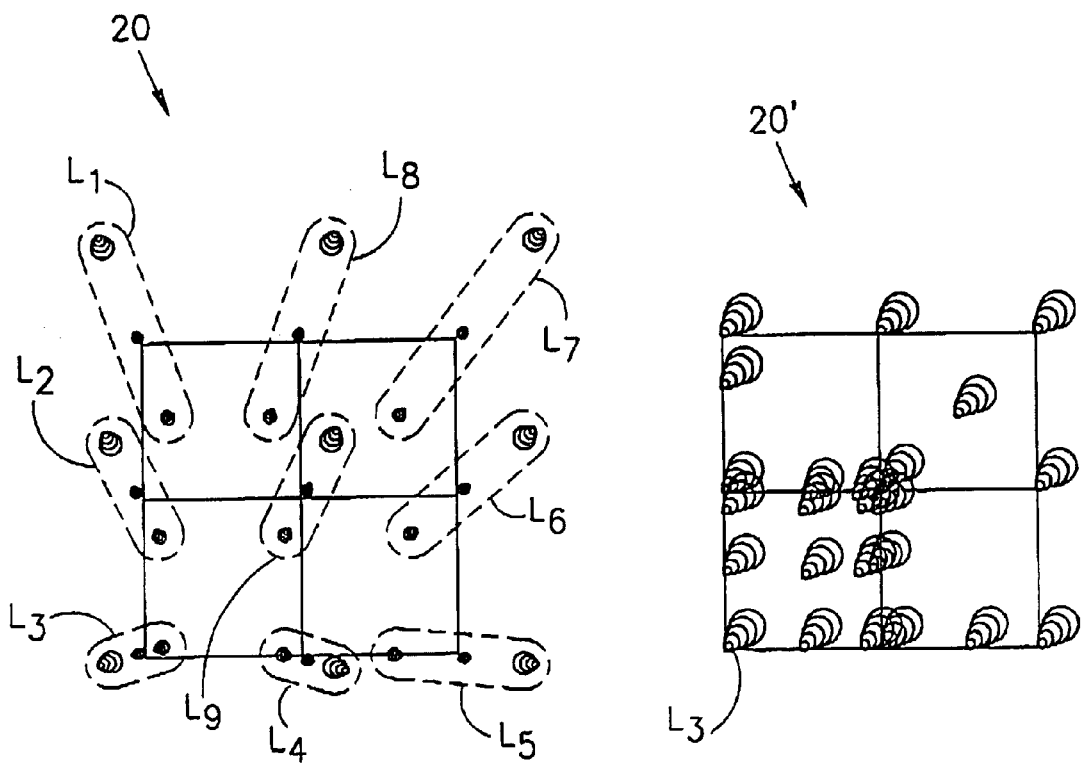
FIG. 8d is a spot diagram corresponding to the beam diagram of FIG. 8b.
FIG. 8e is a spot diagram corresponding to an improved situation, as compared to that of FIG. 8d, due to the operation aperture alignment coils.

FIG. 8d illustrates a spot diagram in the sub-field 20' obtained with the simulation procedure applied to the system 1 with the above operational modes of the deflectors 16 and 18 and of the electrostatic lens 14. The angle of incidence α of the electron beam is about 4.6°. As shown, at the location $L_3$ in the paraxial region of the optical axis OA, the image blurring caused by the different energies of the electrons in the beam is observed, but is significantly lower than that of the periphery region. As illustrated in FIG. 8e, the image blurring in the paraxial region of the optical axis (location $L_3$) could be reduced even more by optimizing the beam propagation with the aperture alignment coils.

Figure 9A:
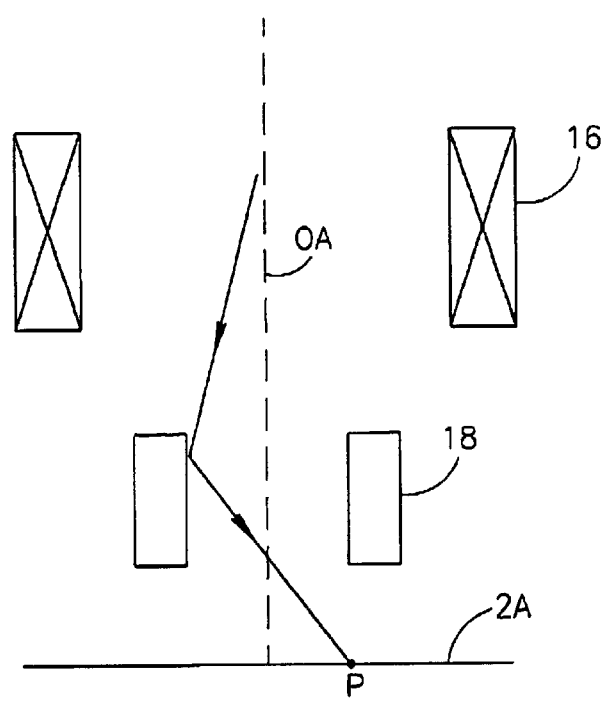
FIGS. 9a and 9b illustrate two examples, respectively. Of an "off-axis tile" mode.
Figure 9B:
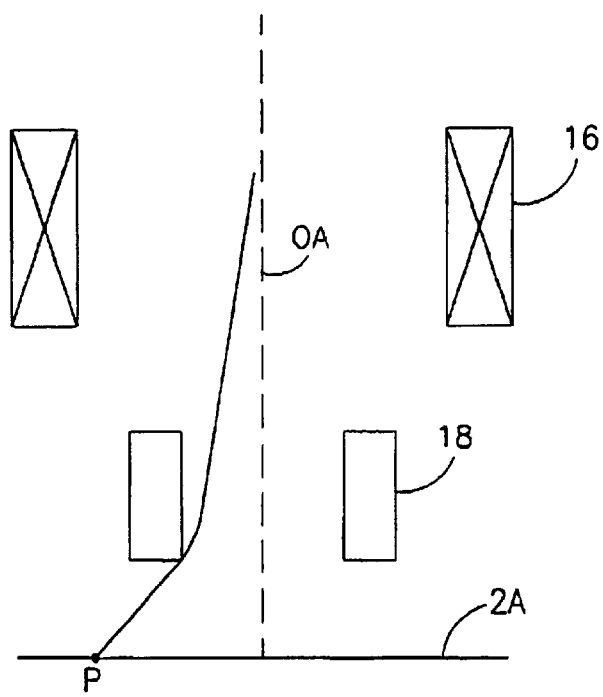

It should be noted that the side wall imaging can be provided by applying a so-called "off-axis tilt" mode, and optionally correspondingly moving the specimen in an inspection plane relative to the column. Such an "off-axis tilt" is illustrated in FIGS. 9a and 9b. In the example of FIG. 9a, the deflectors 16 and 18 deflect the beam in two opposite directions, namely away from the axis OA and towards this axis, respectively. The beam impinges onto an off-axis point P on the wafer. In the example of FIG. 9b, the deflectors 16 and 18 deflect the beam in the same direction, away from the axis OA, and the beam impinges onto the off-axis point P.

Figure 9C:
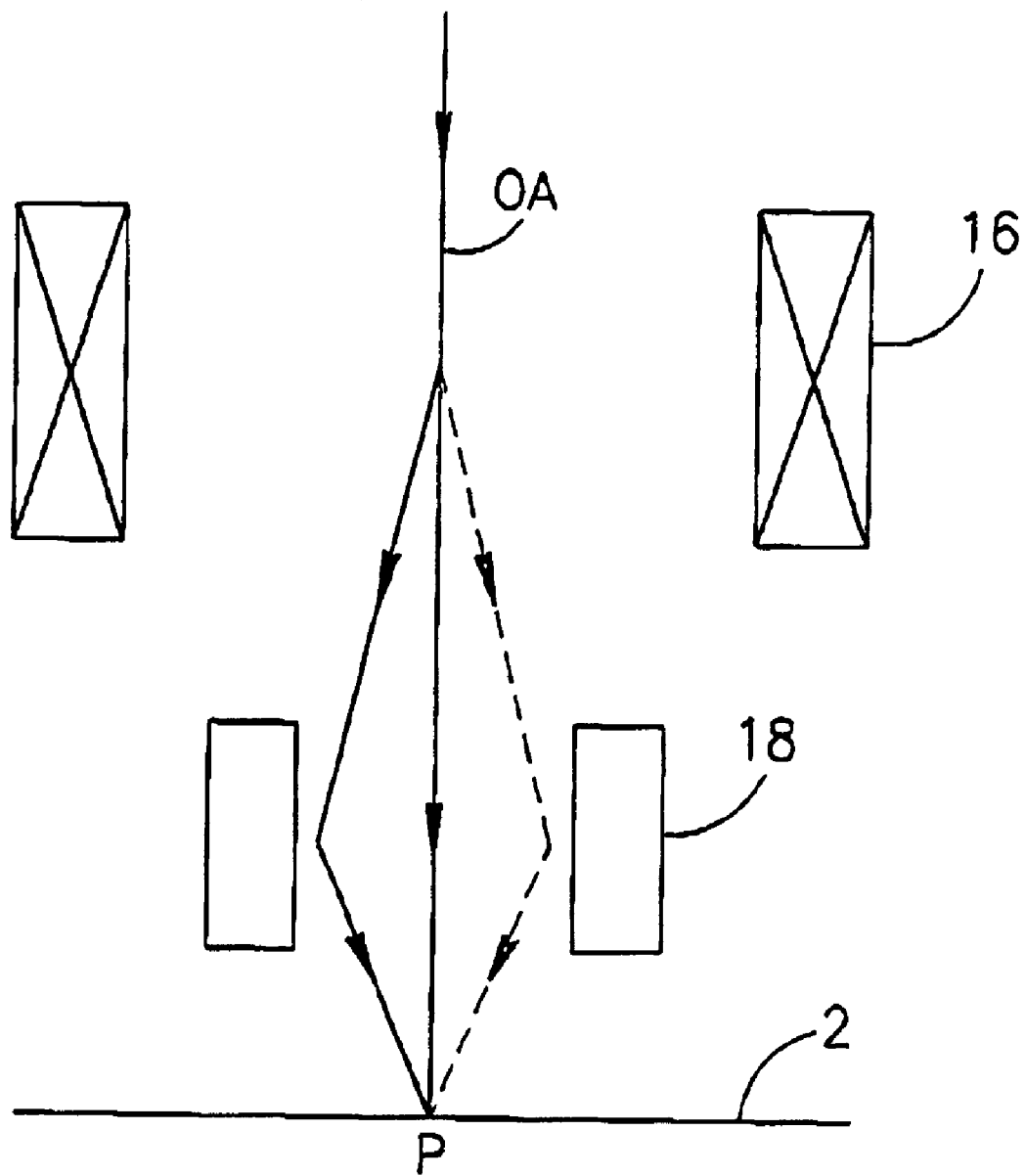
FIG. 9c schematically illustrates the operation of the focusing assembly according to the invention enabling stereoscopic imaging of the wafer.

It is known that the relief of an object can be more carefully inspected by forms a stereoscopic image of the object. For this purpose, at least two images of the same location should be captured at different angles, or symmetrically opposite angles with respect to the optical axis. FIG. 9c illustrates the beam propagation diagram for the purposes of stereoscopic imaging. As shown, the electron beam first impinges onto a point P on the wafer with a certain angle of incidence (solid curve), and then impinges onto the same point P with a symmetrically opposite angle of incidence (dashed curve) with respect to the optical axis OA. This is implemented by sequentially varying the operation of the deflectors 16 and 18 so as to provide sequential changes of the direction of electron beam deflection. Hence, a pair of images is obtained at symmetrically opposite angles, and a stereoscopic image is obtained from this pair of images.

As indicated above, the known techniques utilize the sequential tilting of either the stage holding the wafer or the column, which is a cumbersome and slow operation and requires high accuracy in re-aligning the wafer each time the stage/column is tilted. In contrast, according to the present invention, obtaining a stereoscopic image is made very simple by sequentially reversing the direction fields of the first and second deflections. Since the beam hits the same location (point P) under tilt condition, no re-alignment is necessary.

The advantages of the present invention are thus self-evident. Owing to the provision of the first and second deflectors 16 and 18, and specific operational modes of these deflectors, the SEM system 1 according to the invention enables the following desirable effects to be achieved:

substantial reduction of the chromatic aberrations of deflection leading to substantially uniform image resolution of the entire scan area;

inspection of the wafer with both "normal" and "tilt" modes, without the need for mechanical tilting of the wafer or column; and stereoscopic imaging.

Additionally, it is important to note that the use of the principles of electrostatics allows for the fast scanning of the specimen, thereby preventing it from undesirable charging.

Those skilled in the art will readily appreciate that various modifications and changes may be applied to the preferred embodiment of the invention as hereinbefore exemplified without departing from its scope as defined in and by the appended claims. For example, the deflectors could be either magnetic or electrostatic. The provision of the retarding electrostatic immersion lens is optional. The same effect of electrons' deceleration may be achieved by providing the appropriate potential difference between the pole piece and target, or between the anode and target. The focusing assembly constructed and operated according to the invention may be used in any charged particle beam column of any inspection, metrology, defect review or similar tool.

We claim:

1. A focusing assembly for directing a charged particle beam onto a specimen, the focusing assembly comprising:
   (a) a lens arrangement producing a focusing field;
   (b) a first defector accommodated within the focusing field and operable with a preset mode to provide beam deflection in a predetermined direction; and
   (c) a second deflector accommodated downstream of the first deflector with respect to the direction of beam propagation, the second deflector being operable with a predetermined mode with respect to the operational mode of the first deflector.

2. The assembly according to claim 1, wherein said first deflector and said second deflector deflect the charged particle beam in the same direction.

3. The assembly according to claim 2, wherein said first and second deflectors are adapted to receive an electric field is in a range from (−100)V/mm to (1000)V/mm.

4. The assembly according to claim 2, wherein the first deflector deflects the charged particle beam with positive sign chromatic aberrations, while the second deflector operates together with said electric field to deflect the charged particle beam with negative sign chromatic aberrations.

5. The assembly according to claim 1, wherein said first deflector and said second deflector deflect the incident charged particle beam in two opposite directions, respectively.

6. The assembly according to claim 1, further comprising a voltage source for applying an electric field in the vicinity of the specimen is in a range from 1 kV/mm to 5 kV/mm.

7. The assembly according to claim 1, wherein said lens arrangement comprises a magnetic objective lens.

8. The assembly according to claim 1, wherein said lens arrangement comprises an electrostatic lens producing an electric field.

9. The assembly according to claim 7, wherein said magnetic objective lens produces an electric field.

10. The assembly according to claim 7, wherein an electric field is produced by appropriate potential difference between the specimen and one of the pole pieces of the magnetic lens.

11. A focusing assembly for directing a charged particle beam onto a specimen, the focusing assembly comprising;
    (a) a lens arrangement producing a focusing field;
    (b) a first deflector accommodated within the focusing field and operable with a preset mode to provide beam deflection in a predetermined direction; and
    (c) a second deflector accommodated downstream of the first deflector with respect to the direction of beam propagation, the second deflector being operable with a predetermined mode with respect to the operational mode of the first deflector, wherein said plurality of lenses comprises a magnetic objective lens, and
    wherein planes of deflection produced by the first and second deflectors substantially coincide.

12. The assembly according to claim 11, wherein the first deflector operates to produce a rotation field affecting the trajectory of the charged particle beam.

13. The assembly according to claim 11, wherein the second deflector operates to produce a rotation field affecting the trajectory of the charged particle beam.

14. A focusing assembly for directing a charged particle beam onto a specimen, the focusing assembly comprising:
    a means for producing a focusing field;
    a first deflection means accommodated within the focusing field and operable with a preset mode for deflecting the beam in a predetermined direction; and
    a second deflection means accommodated downstream of the first deflector with respect to the direction of beam propagation and operable for deflecting the beam deflected by the first deflection means in a predetermined direction.

15. A charged particle beam column comprising:
    a charged particle beam source; and
    a focusing assembly which receives a charged particle beam from said charged particle beam source for directing the charged particle beam onto a specimen, said focusing assembly comprising:
    a lens arrangement for producing a focusing field;
    a first deflector accommodated within the focusing field and operable with a preset mode to provide beam deflection in a predetermined direction; and
    a second deflector accommodated downstream of the first deflector with respect to the direction of beam propagation, the second deflector being operable with a predetermined mode with respect to the operational mode of the first deflector.

16. A system for inspecting a specimen by a charged particle beam, the system comprising:
    a charged particle beam source,
    a charged particle beam column produced by said charged particle beam source, and
    detection means for receiving electrons from said specimen,
    wherein the charged particle beam column includes a focusing assembly for directing the charged particle beam onto the surface of said specimen, the focusing assembly comprising:
    a lens arrangement producing a focusing beam;
    a first deflector accommodated within said focusing field and operable with a preset mode to provide a predetermined direction of beam deflection; and
    a second deflector accommodated downstream of the first deflector with respect to the direction of beam propagation, the second deflector being operable with a predetermined mode with respect to the operational mode of the first deflector.

17. A focusing method for directing a charged particle beam onto a specimen, the method comprising the steps of:
    generating a focusing field for focusing the beam onto the specimen;
    generating a first deflection field within said focusing field for deflecting the beam in a predetermined direction; and
    generating a second deflection field downstream of the first deflection field with respect to the direction of beam propagation, said second deflection field deflecting the beam deflected by the first deflection field in a predetermined manner with respect to the first deflection.

18. The method according to claim 17, wherein said predetermined manner of the second deflection is such as to provide the same direction of deflection of the charged particle beam as that of the first deflection.

19. The method according to claim 18, wherein the beam impinges onto the specimen with a certain angle of incidence.

20. A focusing method for directing a charged particle beam onto a specimen, the method comprising the steps of:
   generating a focusing field for focusing the beam onto the specimen;
   generating a first deflection field within said focusing field for deflecting the beam in a predetermined direction; and
   generating a second deflection field downstream of the first deflection field with respect to the direction of beam propagation, said second deflection field deflecting the beam deflected by the first deflection field in a predetermined manner with respect to the first deflection,
   wherein said predetermined manner of the second deflection is such as to provide deflection of the charged particle beam in the direction opposite to that of the first deflection, thereby providing a certain angle of incidence of the beam onto the specimen.

21. The method according to claim 20, wherein said first deflection deflects the beam away from axis of beam propagation towards the specimen, and the second deflection deflects the beam towards the axis of beam propagation.

22. The method according to claim 21, wherein the beam impinges onto the specimen at a location lying substantially on said axis of beam propagation.

23. The method according to claim 17, and also comprising the step of decelerating the beam in the vicinity of the specimen.

24. The method according to claim 23, wherein said second deflection is applied to the charged particle beam within the region of its deceleration.

25. A focusing method for directing a charged particle beam onto a specimen, the method comprising the steps of:
   generating a focusing field for focusing the beam onto the specimen;
   generating a first deflection field within said focusing field for deflecting the beam in a predetermined direction; and
   generating a second deflection field downstream of the first deflection field with respect to the direction of beam propagation, said second deflection field deflecting the beam deflected by the first deflection field in a predetermined manner with respect to the first deflection, and also comprising the step of decelerating the beam in the vicinity of the specimen,
   wherein the beam deceleration is achieved by producing an appropriate electric field within the vicinity of the specimen.

26. A focusing method for directing a charged particle beam onto a specimen, the method comprising the steps of:
   generating a focusing field for focusing the beam onto the specimen;
   generating a first deflection field within said focusing field for deflecting the beam in a predetermined direction; and
   generating a second deflection field downstream of the first deflection field with respect to the direction of beam propagation, said second deflection field deflecting the beam deflected by the first deflection field in a predetermined manner with respect to the first deflection,
   and also comprising the step of selectively reversing the direction fields of the first and second deflections, thereby obtaining stereoscopic images of the specimen.

27. A method for inspecting a specimen by a charged particle beam, the method comprising the steps of:
   (i) generating said charged particle beam and directing it towards the specimen;
   (ii) generating a focusing field for focusing the beam onto the specimen;
   (iii) generating a first deflection field within said focusing field for deflecting the beam in a predetermined direction; and
   (iv) generating a second deflection field downstream of the first deflection field with respect to the direction of beam propagation, said second deflection field deflecting the beam deflected by the first deflection field in a predetermined manner with respect to the first deflection.

28. A method for imaging a specimen by a charged particle beam, the is method comprising the steps of:
   generating said charged particle beam and directing it towards the specimen;
   generating a focusing field for focusing the beam onto the specimen;
   generating a first deflection field within said focusing field for deflecting the beam in a predetermined direction;
   generating a second deflection field downstream of the first deflection field with respect to the direction of beam propagation, said second deflection field deflecting the beam deflected by the first deflection field in a predetermined manner with respect to the first deflection; and
   selectively reversing the direction fields of the first and second deflections, thereby obtaining stereoscopic images of the specimen.

29. The assembly according to claim 1, wherein said first deflector is mounted within a lens gap.

30. The assembly according to claim 14, wherein said first deflection means is mounted within a lens gap.

* * * * *